United States Patent [19]

Hamada

[11] Patent Number: 4,724,545
[45] Date of Patent: Feb. 9, 1988

[54] SQUELCH DETECTING CIRCUIT WITH SQUELCH START DETERMINING MEANS

[75] Inventor: Akira Hamada, Tokyo, Japan

[73] Assignee: NEC Corporation, Japan

[21] Appl. No.: 882,172

[22] Filed: Jul. 7, 1986

[30] Foreign Application Priority Data

Jul. 6, 1985 [JP] Japan .................................. 60-148496

[51] Int. Cl.⁴ .............................................. H04B 1/10
[52] U.S. Cl. .................................... 455/218; 455/212; 455/312
[58] Field of Search .................. 455/35, 212, 213, 218, 455/220–222, 311, 312; 375/104; 328/165

[56] References Cited

U.S. PATENT DOCUMENTS

| | | | |
|---|---|---|---|
| 3,769,592 | 10/1973 | Espe ..................................... | 455/218 |
| 3,805,166 | 4/1974 | Paredes .............................. | 455/218 |
| 3,978,412 | 8/1976 | Frerking ............................ | 455/222 |
| 4,172,996 | 10/1979 | Tokunaga et al. ................. | 455/218 |

Primary Examiner—Jin F. Ng
Attorney, Agent, or Firm—Laff, Whitesel, Conte & Saret

[57] ABSTRACT

A squelch detecting circuit comprises a narrow bandpass filter (16) for obtaining, as a filtered signal, a desired IF carrier frequency signal. The filtered signal is envelope-detected at a detector (17) and the detected signal is compared with a predetermined squelch level at a voltage comparator (21). The voltage comparator produces a first signal when the detected signal is below the squelch level and produces a second signal when the detected signal is above the squelch level. A squelch start determining circuit (22) produces a squelch alarm signal after the first signal is continued for a predetermined time period, and the squelch alarm signal is maintained until the second signal is inputted to the squelch start determining circuit (22), so that the transmitter and receiver characteristic test using the carrier frequency sweeping can be performed without any squelch alarm signal produced.

3 Claims, 7 Drawing Figures

SQUELCH DETECTING CIRCUIT WITH SQUELCH START DETERMINING MEANS

BACKGROUND OF THE INVENTION (1) Field of the Invention

The present invention relates to a squelch detecting circuit in a radio receiver and, in particular, to the squelch detecting circuit which does not interfere measurement of transmitting properties of transmitters and receivers.

(2) Description of the Prior Art

A squelch system has been used in a radio receiver in, for example, a VHF band, a UHF band, or a microwave band, in order to block the output of the radio receiver automatically when a carrier received is reduced to or below a predetermined threshold level.

The squelch system comprises a squelch detecting circuit connected to a front end portion of the receiver. The squelch detecting circuit comprises a detector which detects an envelope of a predetermined carrier frequency in a signal inputted thereto. The detected envelope signal is applied to a voltage comparator which, in turn, produces a squelch alarm signal when the detected envelope signal is equal to, or lower than, a predetermined squelch level corresponding to the threshold level. The squelch alarm signal is applied to a squelch gate, which in turn, mutes the output from the receiver.

Generally speaking, the front end portion of the receiver has a wide frequency band sufficient to protect a desired carrier frequency signal from distortion. Accordingly, the signal applied to the squelch detecting circuit comprises not only the desired carrier frequency signal component but also adjacent frequency signal components. Therefore, no squelch alarm signal is produced from the squelch detecting circuit due to existence of the adjacent frequency signal components even when the desired carrier frequency signal is reduced to or below the threshold level.

In order to resolve such an erroneous operation of the squelch detecting circuit, it is known in the prior art to use a narrow bandpass filter in the squelch detecting circuit. The narrow bandpass filter is for eliminating all but those frequencies close around the desired carrier frequency. A filtered signal passing through the narrow bandpass filter is applied to the detector.

In use of the narrow bandpass filter, the operation of the squelch detecting circuit is not interfered by existence of the adjacent frequency signal components but the squelch alarm signal is reliably produced in response to only the desired carrier frequency signal reduced to or below the threshold level.

On the other hand, a test is sometimes performed for measuring transmission characteristics, for example, the amplitude-frequency characteristic, the delay response, or others of a transmitter and a receiver. In such a test, the carrier is frequency swept repeatedly by a predetermined low frequency, for example, a frequency (50 Hz or 60 Hz) of a commercial electric power source across a proper or assigned frequency of the carrier.

In the test using the carrier frequency sweeping, the squelch detecting circuit having the narrow bandpass filter produces the squelch alarm signal each time when the carrier frequency is swept out of the passband of the narrow bandpass filter, so that the transmission characteristics cannot correctly measured.

Japanese Utility Model (U.M.) Publication No. 13,643/83 proposes a resolution of the problem. The Japanese U.M. discloses to use a time constant circuit so that the detected envelope signal is applied to the voltage comparator through the time constant circuit. In the arrangement, the detected envelope signal is integrated at the time constant, the integrated voltage reduces at the same time constant when the detected envelope signal becomes zero level. Accordingly, the input voltage level of the voltage comparator is generally maintained above the squelch level, even if the carrier frequency is swept out of the passband of the narrow bandpass filter. Thus, start of the squelch alarm signal is delayed so that no squelch alarm signal is produced during the test.

Reviewing the purpose of the squelch system, the narrow bandpass filter is desired to have a narrower passband and the squelch signal is desired to be stopped immediately when the desired carrier signal is recovered above the threshold level.

However, the narrower bandpass filter cannot be used in the squelch detecting circuit using the time constant circuit because the output signal level of the time constant circuit becomes below the squelch level during a time when the carrier frequency is swept out of the passband of the narrower bandpass filter so that the squelch alarm signal is produced.

Further, once the squelch alarm signal is produced from the squelch detecting circuit using the time constant circuit, the squelch alarm signal is not stopped immediately when the desired carrier signal is recovered above the threshold level. This is because recovery of the input signal level of the voltage comparator is delayed by the time constant circuit.

SUMMARY OF THE INVENTION

It is an object of the present invention to provide a squelch detecting circuit which can use a narrow bandpass filter of a reduced passband and wherein a squelch alarm signal start is delayed so that the measurement of transmission characteristics of the transmitter and the receiver is not interfered by the squelch detecting circuit in the test using the carrier frequency sweeping.

It is another object of the present invention to provide the squelch detecting circuit wherein the squelch alarm signal is stopped immediately when the carrier frequency signal level is recovered above the threshold level.

The present invention is directed to a squelch detecting circuit for detecting a carrier signal level of a predetermined frequency carrier in an input signal thereto to produce a squelch alarm signal when the carrier level signal is equal to, or lower than, a predetermined threshold level. The squelch detecting circuit according to the present invention comprises narrow bandpass filter means for eliminating all but those frequency components close around the predetermined frequency. The filtered signal is applied to detector means which in turn, detects an envelope of the filtered signal to produce, as an envelope signal, a voltage signal representative of the envelope of the filtered signal. Voltage comparator means compares a voltage level of the envelope signal with a reference voltage corresponding to the predetermined threshold level. The voltage comparator means produces a first signal of a first voltage level when the envelope signal voltage level is equal to, or lower than, the reference voltage, and produces a second signal of a second voltage level when the envelope signal voltage is higher than the reference voltage. Squelch start determining means in response to the first signal and produces the squelch alarm signal continuously after the first signal is continuously received for a predetermined time period. The squelch alarm signal is stopped immediately when the second signal is received.

DETAILED DESCRIPTION OF PREFERRED EMBODIMENT

At first, the known squelch detecting circuit disclosed in the above-described Japanese U.M. Publication No. 13,643/83 will be described in order to make it easy to understand the present invention.

Figure 1:
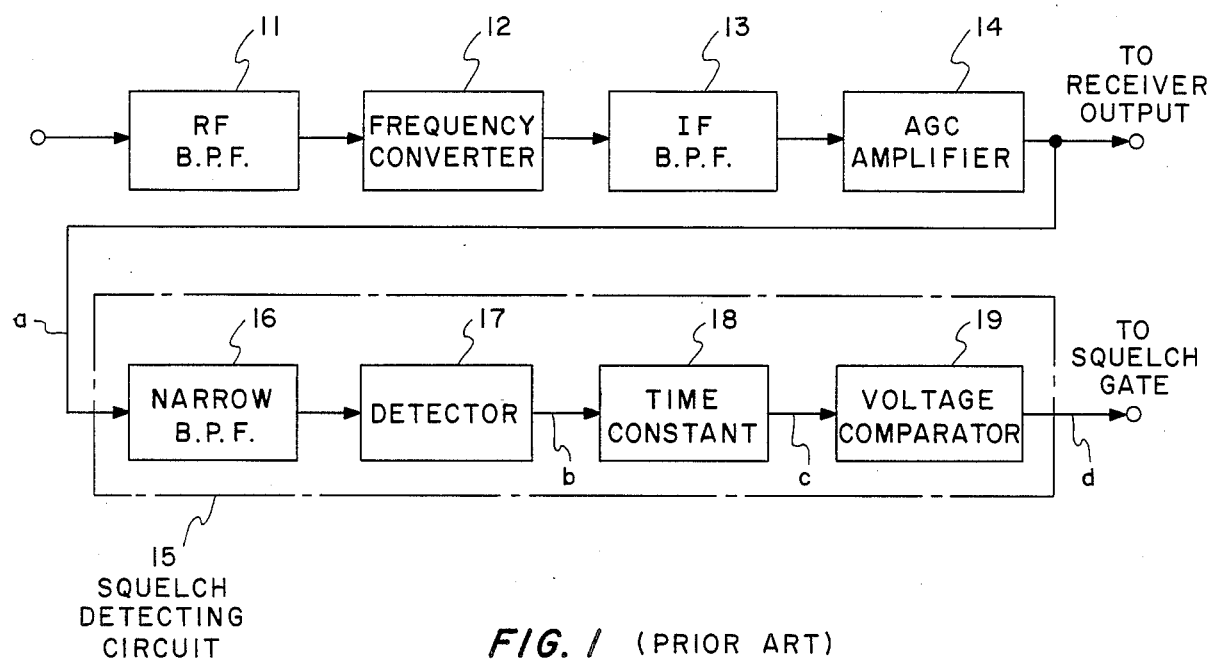
FIG. 1 is a block diagram view illustrating a front end portion of a receiver and a known squelch detecting circuit associated thereto.

Referring to FIG. 1, there is shown a front end of a receiver comprising an RF (radio frequency) bandpass filter (B.P.F.) 11, a frequency converter 12, an intermediate frequency (IF) B.P.F. 13, and an AGC (automatic gain control) amplifier 14. On the output side of the AGC amplifier, is connected a receiver output circuit (not shown) including a squelch gate, as well known in the prior art.

A squelch detecting circuit 15 receives an IF signal as an input signal from the AGC amplifier 14 and detects a desired IF carrier frequency signal. When the IF carrier frequency signal is reduced to or below the squelch level, the squelch alarm signal is produced and delivered to the squelch gate.

The known squelch detecting circuit 15 comprises a narrow B.P.F. 16 for eliminating all but those frequency components close around the desired IF carrier signal. The filtered signal is applied to a detector 17 and an envelope signal is produced. The envelope signal is applied to voltage comparator 19 through a time constant circuit 18. When the envelope signal is continuously lower than a predetermined squelch or reference voltage level for a certain time period determined by the time constant of the circuit 18 due to reduction of the desired IF carrier signal strength, the squelch alarm signal is produced. Thereafter, when the desired IF carrier signal level is recovered and when the envelope signal becomes to a level higher than the reference voltage, the squelch alarm signal is stopped with a delay determined by the time constant of the circuit 18.

In the test for measuring the transmission characteristics of the transmitter and the receiver, the carrier is frequency-swept around the proper frequency of the carrier as described hereinbefore. Thus, the IF carrier frequency a inputted to the squelch detecting circuit 15 periodically varies by $\pm f_1$ around the proper IF carrier frequency $f_0$ as shown at a in FIG. 2.

Providing that the passband of the narrow B.P.F. 16 is $\pm f_p$ around $f_0$, no output signal is obtained from the narrow B.P.F. 16 during a time period when the carrier frequency is swept to a frequency above $(f_0+f_p)$ or below $(f_0-f_p)$. Accordingly, no output signal is provided from the detector 17 as shown at b in FIG. 2 during the time period, but a constant level signal is obtained during a time period when the IF carrier frequency is within an extent between $(f_0+f_p)$ and $(f_0-f_p)$.

Figure 2:
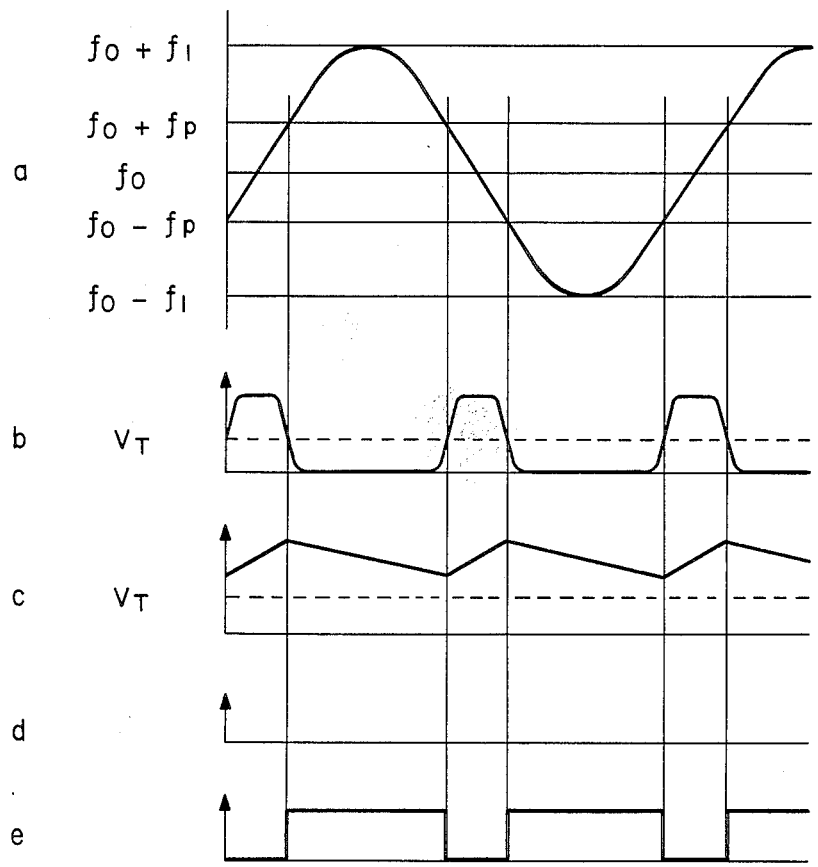
FIG. 2 is a view illustrating waveforms at various points in the circuit of FIG. 1 for explaining operation of the known squelch detecting circuit in the test using the carrier frequency sweeping.

If the outupt signal of the detector 17 is directly applied to the voltage comparator 19, it is compared with the squelch level $V_T$ and the squelch alarm signal is produced from the comparator 19 during a time period when the IF carrier frequency is swept at a frequency higher than $(f_0+f_p)$ or lower than $(f_0-f_p)$ as shown at e in FIG. 2. Accordingly, the test results in fault.

This is resolved by use of the time constant circuit 18. The output signal of the detector 17 is applied to the time constant circuit 18 and is integrated thereat. The integrated voltage is discharged when no output signal is obtained from the detector 17. Therefore, the output signal of the time constant circuit 18 is maintained higher than the squelch level $V_T$ as shown at c in FIG. 2. Accordingly, the squelch alarm signal is not produced from the voltage comparator 19 as shown at d in FIG. 2. Thus, the test is not interfered However, the output signal level is determined by the time constant of the circuit 18 and a time period when the output signal is obtained from the detector 17. When the passband of the narrow B.P.F. 16 is reduced, the output signal from the detector 17 is produced for a reduced time period. Therefore, the integrated voltage level at the time constant circuit 18 is not sufficiently high so that the output signal of the time constant circuit 18 disadvantageously becomes lower than the squelch level during a time period when no output signal is obtained from the detector 17. Then, the squelch alarm signal is produced from the voltage comparator 19.

Therefore, the passband of the narrow B.P.F. 16 cannot be reduced below a limit passband.

Figure 3:
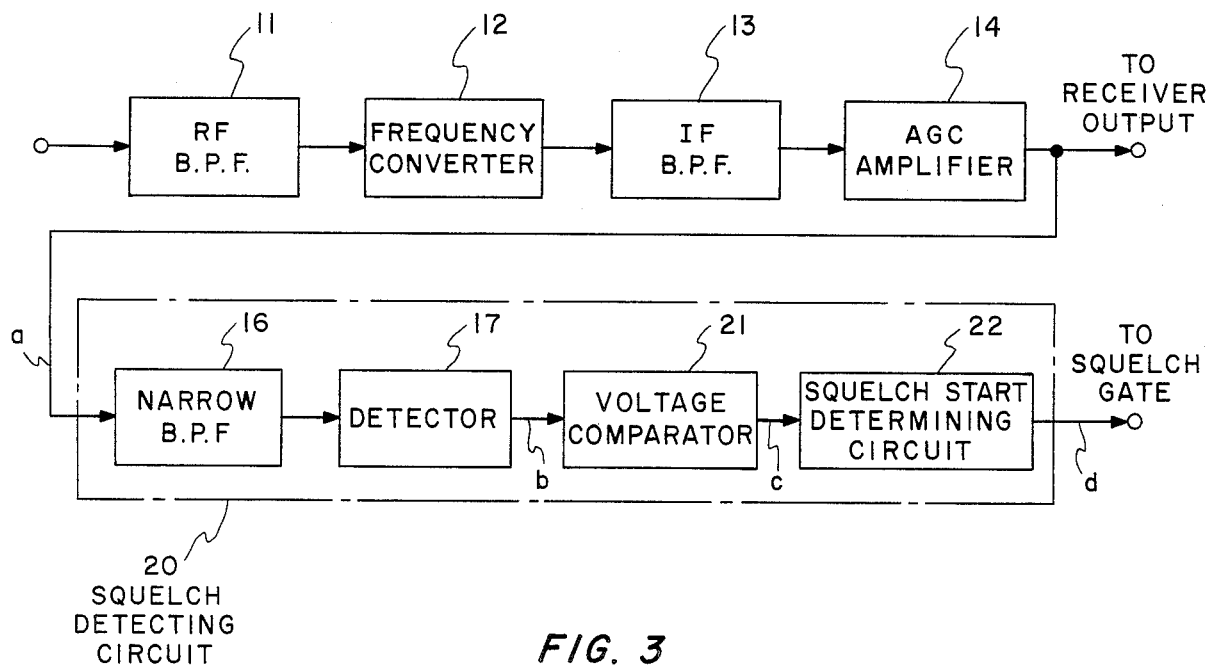
FIG. 3 is a block diagram view similar to FIG. 1 but illustrating a squelch detecting circuit according to an embodiment of the present invention.

Referring to FIG. 3, a circuit shown therein is similar to the circuit as shown in FIG. 1 except that a squelch detecting circuit 20 according to the present invention is partially different from the known squelch detecting circuit 15 in FIG. 1.

The similar parts are represented by the same reference numerals as in FIG. 1 and detailed description thereto is omitted for the purpose of the simplification of the description.

The squelch detecting circuit 20 also comprises the narrow B.P.F. 16 and the detector 17 similar to the known squelch detecting circuit.

A voltage comparator 21 similar to the comparator 19 in FIG. 1 is directly connected to the output of the detector 17. To the output of the voltage comparator 21, a squelch start determining circuit 22 is connected.

Figure 4:
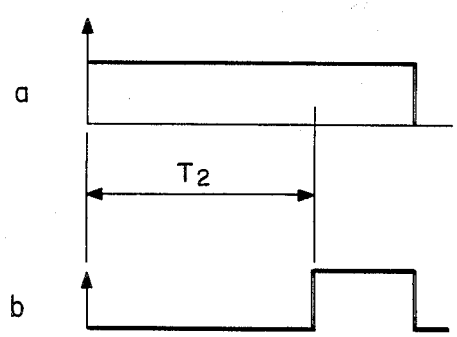
FIG. 4 is a view illustrating an input and an output signal waveform of a squelch start determining circuit in FIG. 3.

The squelch start determining circuit 22 has an input-to-output response as shown in FIG. 4. That is, when the input signal is continuously maintained at a high level for a predetermined time interval $T_2$ as shown at a in FIG. 4, the outut signal changes from a low level to a high level as shown at b in FIG. 4. Thereafter, the high level output signal is maintained until the input signal changes into a low level, and changes into the low level immediately when the input signal changes from a high level to a low level, as shown in FIG. 4.

Examples of the squelch start determining circuit 22 will be described in connection with FIGS. 6 and 7 hereinafter.

In operation of the squelch detecting circuit 20, the IF signal is supplied to the narrow B.P.F. 16, where the frequency components close around the desired IF carrier frequency are filtered. The filtered signal is envelope-detected at the detector 17. The detected envelope signal is applied to the voltage comparator 21 and is compared with the squelch or reference voltage level $V_T$.

When the desired carrier frequency signal strength is weak and when the detected envelope signal is therefore lower than the reference voltage level $V_T$, the voltage comparator 21 produces a high level signal which is supplied to the squelch start determining circuit 22. After the high level signal from the voltage comparator 21 is continued for the time period $T_2$ or more, a high level signal or the squelch alarm signal is produced from the squelch start determining circuit 22 and is maintained. That is, the squelch alarm signal is started with a delay of a time period $T_2$ from a time when the input strength of the desired carrier frequency signal becomes lower than the threshold level. Thereafter, when the input strength is recovered higher than the threshold level, the output signal of the voltage comparator 21 is changed into a low level. Then, the squelch alarm signal is stopped immediately.

In the test using the carrier frequency sweeping, the IF carrier frequency is swept by $\pm f_1$ around the proper frequency $f_0$ as described hereinbefore. The frequency swept IF carrier is shown at a in FIG. 5, which is similar to a in FIG. 2. The output signals of the detector 17 and the voltage comparator 21 are represented at b and e in FIG. 5 which are similar to the waveforms b and e in FIG. 2 by the same reason as described in connection with b and e in FIG. 2.

When the time period $T_2$ of the squelch start determining circuit 22 is selected longer than a half ($\frac{1}{2}$) of a repetition period ($T_1$ in FIG. 5) of the carrier frequency sweeping and therefore a time period ($T_3$) when the carrier frequency is swept higher than ($f_0+f_p$) or lower than ($f_0-f_p$), no squelch alarm signal is produced from the squelch start determining circuit 22.

Figure 5:
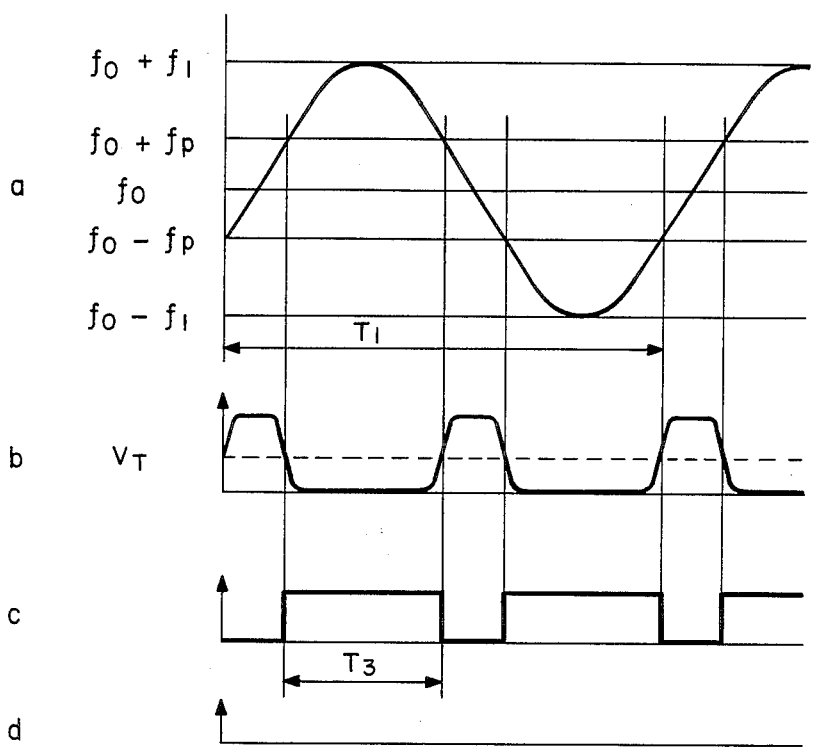
FIG. 5 is a view illustrating waveforms at various points in the circuit of FIG. 3 for explaining operation of the squelch circuit in the test using the carrier frequency sweeping.

Even if the passband of the narrow B.P.F. 16 is reduced, it will be understood that any squelch alarm signal is not produced from the squelch start determining circuit 22 in the test, as shown at d in FIG. 5. Thus, the test is not interfered by the squelch detecting circuit 20.

Figure 6:
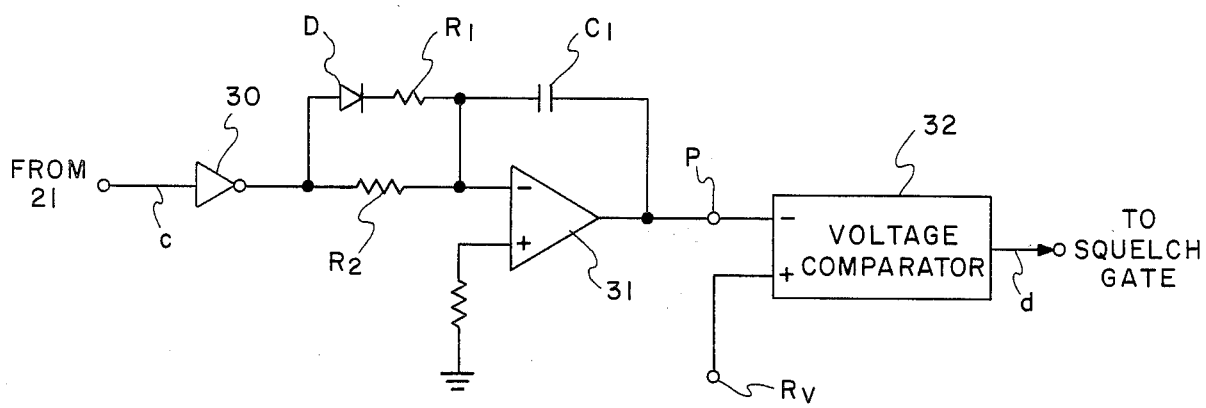
FIG. 6 is a circuit diagram view illustrating an embodiment of the squelch start determining circuit of FIG. 3.

Referring to FIG. 6, an embodiment of the squelch start determining circuit (22 in FIG. 3) comprises an inverter 30, and an operating amplifier 31 having an inverted input terminal and a non-inverted input terminal. The non-inverted input terminal is grounded through a resistor. The inverted input terminal is connected to an output terminal of the operating amplifier 31 through a capacitor $C_1$. An output of the inverter 30 is connected to the non-inverted input terminal through a diode D and a resistor $R_1$ in series with each other. The inverter output is also connected to the non-inverted input terminal through another resistor $R_2$ having a larger resistance than resistor $R_1$. The output terminal of the operating amplifier 31 is connected to an input terminal of a voltage comparator 32 which compares the output voltage of the operating amplifier 31 and a reference voltage $R_v$.

When a high or positive level signal is applied to the inverter 30, an inverted, or negative, level signal is applied to the capacitor $C_1$ through the resistor $R_2$ of a high resistance. The capacitor $C_1$ is charged with a time constant determined by the resistor $R_2$ and the capacitor $C_1$. When the inverted input terminal becomes negative, the output terminal P becomes positive. Then, the voltage comparator 32 produces a high level signal or the squelch alarm signal.

In this connection, the reference voltage $R_v$ is selected lower than the positive output of the operating amplifier 31, for example, the ground potential. The squelch alarm signal is delayed from the high level signal input to the inverter 30. The delay gives the time interval $T_2$ (FIG. 4) and is determined by the time constant defined by the resistor $R_2$ and the capacitor $C_1$. Accordingly, the time interval $T_2$ can be selected to an arbitrary value.

When a low level or a negative signal is applied to the inverter 30, the inverted, or positive signal is supplied to the capacitor $C_1$ through the diode D and the resistor $R_1$. Since the resistor $R_1$ is selected to have a sufficiently small resistance, the capacitor $C_1$ is rapidly charged in positive, and the inverted input terminal becomes positive immediately. Accordingly, the output voltage of the operating amplifier 31 is negative and therefore, the squelch alarm signal from the comparator 32 is stopped immediately.

Figure 7:
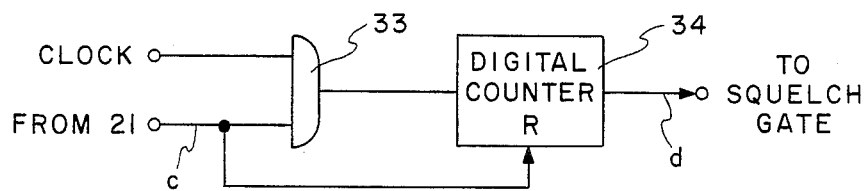
FIG. 7 is a circuit diagram view illustrating another embodiment of the squelch start determining circuit.

Another embodiment of the squelch start determining circuit (22 in FIG. 3) is shown in FIG. 7. The circuit comprises an AND gate 33 having two input terminals. Clock pulses are supplied to one of the two input terminals of the AND gate 33 from a clock pulse generator (not shown). To the other input terminal, is applied the output signal from the voltage comparator 21 (in FIG. 3). An output of the AND gate 33 is connected to a digital counter 34. When the digital counter 34 counts up to a predetermined maximum count value, it produces a high level signal of the squelch alarm signal, which is maintained until the counter 34 is reset by a negative reset signal applied to a reset terminal R.

When a high level or a positive signal is applied to the AND gate 33 from the comparator 21, the clock pulses are supplied to the digital counter 34 and are counted up thereat. When the counted number reaches the predetermined maximum value, the squelch alarm signal is produced and maintained thereafter until a low level or a negative signal is applied from the comparator 21 to the AND gate 33 and the reset terminal R.

The time interval or delay of the squelch start determining circuit is determined by the predetermined maximum value of the counter 34, and therefore, can be selected to an arbitrary value.

What is claimed is:

1. A squelch detecting circut for detecting a carrier signal level of a predetermined frequency carrier in an input signal thereto to produce a squelch alarm signal when said carrier level signal is equal to, or lower than, a predetermined threshold level, said squelch detecting circuit comprising:
   narrow bandpass filter means for eliminating all but those frequency components close around said predetermined frequency component in said input signal, said narrow bandpass filter means producing, as a filtered signal, the frequency signal close around said predetermined frequency;

detector means for detecting an envelope of said filtered signal to produce, as an envelope signal, a voltage signal representative of the envelope of said filtered signal;

first comparator means for comparing a voltage level of said envelope signal with a first reference voltage, said first reference voltage being corresponding to said predetermined threshold level, said first voltage comparator means producing a first signal of a first voltage level when said envelope signal voltage level is equal to, or lower than, said first reference voltage, said first voltage comparator means producing a second signal of a second voltage level when said envelope signal voltage level is higher than said first reference voltage; and squelch start determining means responsive to said first signal for producing said squelch alarm signal continuously after said first signal is continuously received for a predetermined time period, said squelch start determining means stopping to produce said squelch alarm signal when said second signal is received.

2. A squelch detecting circuit as claimed in claim 1, wherein said first signal is a high level signal with said second signal being a low level signal, and wherein said squelch start determining means comprises an operating amplifier having an inverted input terminal, a non-inverted input terminal, and an output terminal, a capacitor connecting said inverted input terminal to said output terminal, a first resistor having a large resistance for supplying said first signal to said capacitor, a series circuit of a diode and a second resistor for supplying said second signal to said capacitor, said second resistor having a resistance sufficiently smaller than said first resistor, said non-inverted terminal being supplied with a second reference voltage lower than said first voltage level but higher than said second voltage level, and a second voltage comparator for comparing an output signal level of said operating amplifier with a third reference voltage, said third reference voltage being determined lower than said first voltage level but higher than said second voltage level, said second voltage comparator producing the squelch alarm signal when the output signal level of said operating amplifier is lower than said third reference voltage.

3. A squelch detecting circuit as claimed in claim 1, wherein said first signal is a high level signal with said second signal being a low level signal, and wherein said squelch start determining means comprises an AND gate having a first and a second input terminal and an output terminal, an output signal of said first or said second signal of said first voltage comparator means being applied to said first input terminal, clock pulses being applied to said second input terminal, said AND gate responsive to said first signal for producing said clock pulses at said output terminal, and a counter having a predetermined maximum count value for counting up said clock pulses on said output terminal of said AND gate to produce said squelch alarm signal when the counted number reaches to said predetermined maximum count value, said counter being reset by said second signal.

* * * * *